United States Patent

Krappel et al.

[11] Patent Number: 5,877,563
[45] Date of Patent: Mar. 2, 1999

[54] FUSE DEVICE FOR A CABLE IN MOTOR VEHICLES

[75] Inventors: Alfred Krappel, Ismaning; Robert Albiez, Reichertshofen; Maximilian Groebmair, Dietramszell, all of Germany

[73] Assignee: Bayerische Motoren Werke Aktiengellschaft, Munich, Germany

[21] Appl. No.: 595,866

[22] Filed: Feb. 6, 1996

[30] Foreign Application Priority Data

Feb. 6, 1995 [DE] Germany ............. 195 03 809.6

[51] Int. Cl.⁶ ............................................. B60K 28/10
[52] U.S. Cl. .................. 307/10.1; 180/271; 180/279; 200/61.08
[58] Field of Search ..................... 307/9.1–10.8, 307/119; 180/271, 274, 279, 281–283; 200/61.08; 361/115; 280/727

[56] References Cited

U.S. PATENT DOCUMENTS

| 4,149,093 | 4/1979 | D'Alessio et al. ............... 320/40 |
| 4,224,487 | 9/1980 | Simonsen ...................... 200/61.08 |
| 4,799,126 | 1/1989 | Kruse et al. ...................... 361/101 |
| 4,888,535 | 12/1989 | Brussasco ........................ 307/10.1 |
| 4,902,956 | 2/1990 | Sloan ............................... 307/10.7 |
| 5,019,935 | 5/1991 | Nakamura ........................ 361/45 |
| 5,510,658 | 4/1996 | Nakayama ....................... 307/10.1 |
| 5,521,788 | 5/1996 | Miyazaki ......................... 361/42 |
| 5,535,842 | 7/1996 | Richter et al. ................... 180/279 |
| 5,574,316 | 11/1996 | Nieschulz ......................... 307/10.7 |

FOREIGN PATENT DOCUMENTS

| 0 632 558 | 1/1995 | European Pat. Off. . |
| 0 243 076 | 10/1997 | European Pat. Off. . |
| 1434280 | 1/1966 | France . |
| 41 10 240 | 10/1992 | Germany . |
| 42 08 011 | 9/1993 | Germany . |
| 44 13 847 | 11/1994 | Germany . |
| 614 317 | 11/1979 | Switzerland . |
| 2260635 | 4/1993 | United Kingdom . |

OTHER PUBLICATIONS

*Elektronik*, 8, Apr. 18, 1986, p. 93 entitled "Stromwächter für Niederspannungs–Netzteile" by H.J. Roth.

*Primary Examiner*—John W. Cabeca
*Assistant Examiner*—Peter Ganjian
*Attorney, Agent, or Firm*—Evenson, McKeown, Edwards & Lenahan, P.L.L.C.

[57] ABSTRACT

A fuse device for a cable in vehicles, includes a current strength sensor having an evaluation circuit connected downstream, and a severing device for the cable. The severing device disconnecting the cable when a current strength exceeds a limiting value. The sensor, evaluation circuit, and severing device are located in a housing in which a section of the cable also runs.

18 Claims, 7 Drawing Sheets

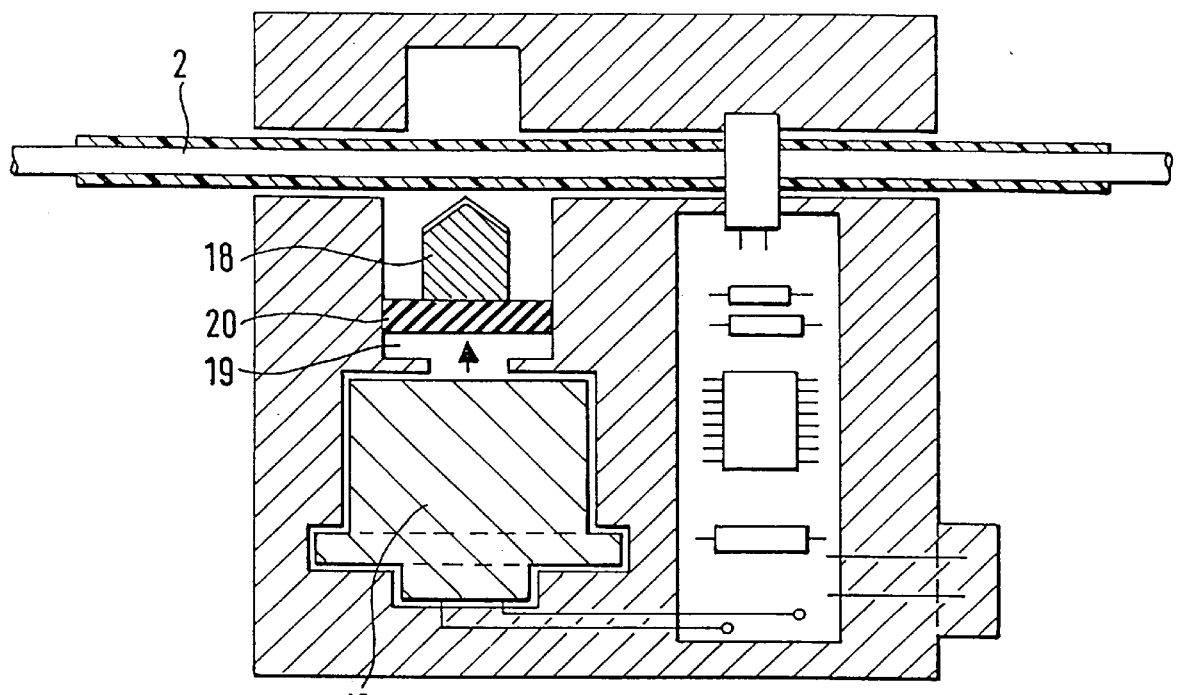
FIG. 3
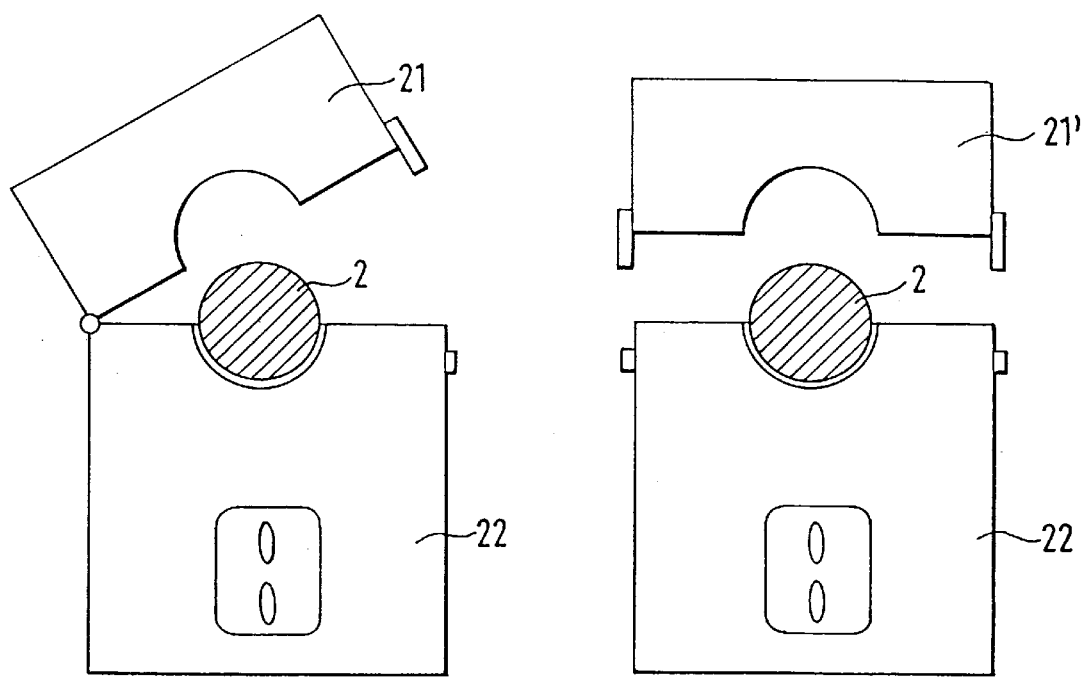
FIG. 4A
FIG. 4B

FUSE DEVICE FOR A CABLE IN MOTOR VEHICLES

BACKGROUND AND SUMMARY OF THE INVENTION

The invention relates to a fuse device and, more particularly, to a fuse device for a cable in motor vehicles with a current strength sensor, an evaluation circuit connected downstream of the current strength sensor, and a severing device for severing the cable at a current strength that lies above a limiting value.

A known fuse device is described in German Patent document DE 41 10 240 C. The sensor, evaluation circuit, and severing device are spatially separate from one another. The sensor is located above an exposed portion of the cable separate from the severing device. Separate lines run between the sensor and the evaluation circuit on the one hand, and between the evaluation circuit and the severing device on the other hand. The design of the known fuse device is therefore expensive and especially prone to problems that can disadvantageously occur in the especially critical case of an accident. The connecting leads between the sensor and the severing device and the evaluation circuit are exposed to the risk of damage or destruction. This can lead to an ineffectiveness of the known fuse device at precisely the time of a critical situation such as an accident as mentioned above.

There is therefore needed a fuse device of the abovementioned type such that it is characterized by a simple design and high effectiveness.

These needs are met according to the present invention by fuse device for a cable in motor vehicles with a current strength sensor, an evaluation circuit connected downstream of the current strength sensor, and a severing device for severing the cable at a current strength that lies above a limiting value. The sensor, evaluation circuit, and severing device are located in a housing in which a section of the cable also runs.

Advantageously, the compact design of the fuse device according to the invention means, first of all, that there is no danger of its destruction, especially in an accident. At the same time, the design results in a definite reduction, if not complete elimination, of functional problems, specifically during an accident. The fuse device can be located at any point, for example directly behind or integrated with the positive terminal of a vehicle battery, or directly behind or integrated with a battery support. The compact design of the fuse device also influences the cost. In contrast to known fuse devices, there are definite cost advantages which make it possible to use the fuse device in a multiple manner in a cable to monitor for example a plurality of line sections that are especially at risk.

Advantageous embodiments of the invention are characterized by: 1) further reduction of the wire cost; 2) the possibility of replacing the fuse device after the severing device has operated, without performing extensive repairs on the cable for that purpose; 3) the possibility of performing this repair in an especially prompt and inexpensive manner; 4) further reduction in the size of the total structure and, hence, in the manufacturing costs; 5) achieving a further cost reduction by multiple use of the current sensor; 6) an additional possibility of replacing the fuse device without great expense; 7) when the current load is high as a result of operation, the possibility of preventing activation of the severing device (typically when starting an internal combustion engine); and 8) the possibility of adjusting the triggering threshold for the severing device to the changing current loads on the cable.

The possibility of adjusting the triggering threshold for the severing device to the changing current loads on the cable offers a wide variety of possibilities. Thus, it is not only possible to take into account load fluctuations occurring in rapid sequence and to quickly modify the triggering threshold for the severing device, but also to take into account loads related to operations that vary from one vehicle to another, and which are caused, for example, by the use of different electrical consumption devices. It is also possible to take into account a change in the current load that occurs during long-term operation as the result of slowly changing electrical properties of various electrical consumers. Such a phenomenon is comparable with long-term drift and can be recognized, for example, by differentiation of the current changes, for example in addition to or directly during defined loads on the cable.

Other objects, advantages and novel features of the present invention will become apparent from the following detailed description of the invention when considered in conjunction with the accompanying drawings.

BRIEF DESCRIPTION OF THE DRAWINGS

FIG. 3 illustrates a housing for the fuse device according to FIGS. 1 and 2;

FIGS. 4A an 4B illustrate further embodiments of the housing according to the present invention;

DETAILED DESCRIPTION OF THE DRAWINGS

Figure 1:
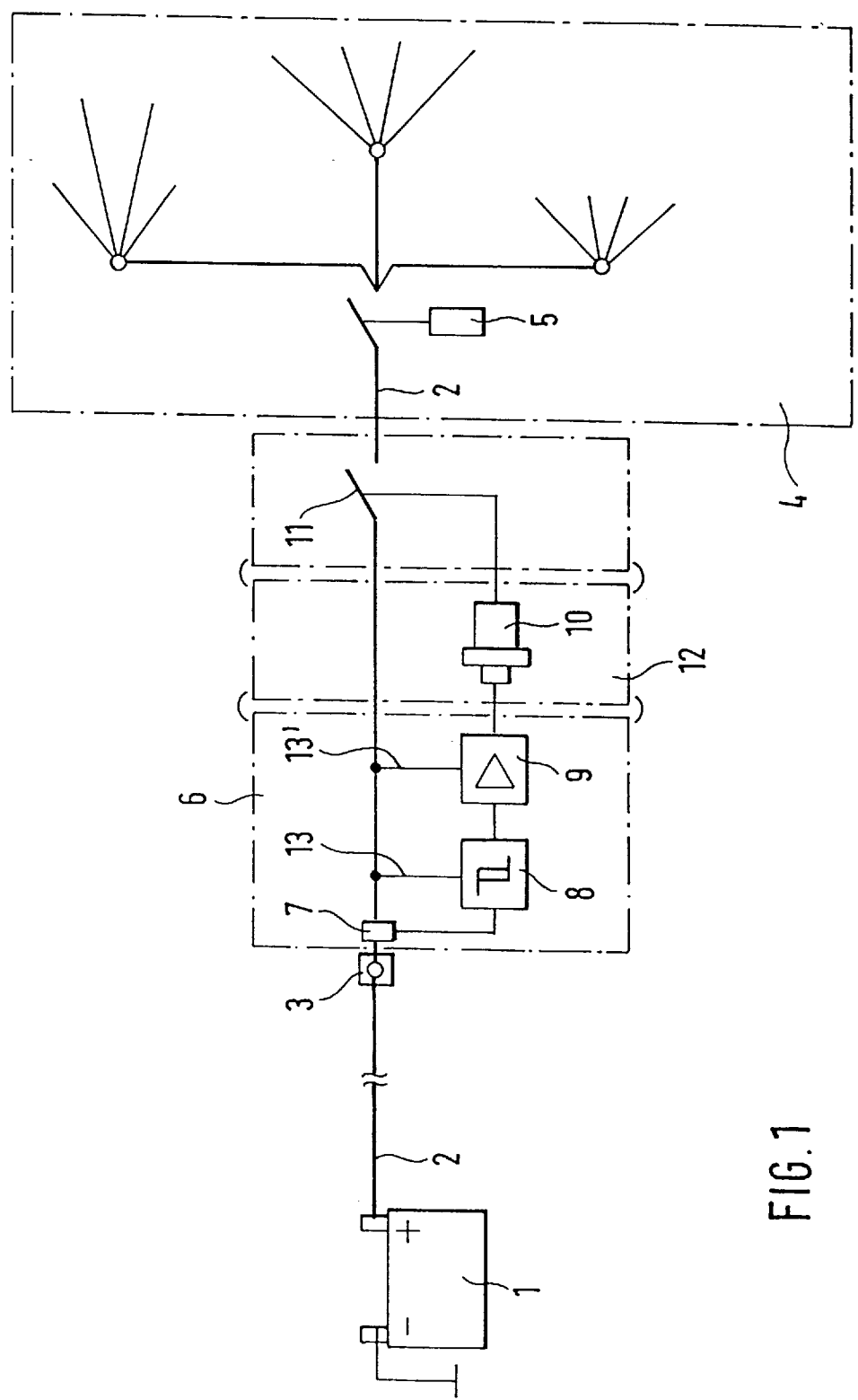
FIG. 1 is a schematic diagram of the fuse device according to the invention.

FIG. 1 shows the use of the fuse device according to the invention in a motor vehicle. A battery 1, a battery cable 2 connected with the positive terminal, a battery support 3, and an engine cable tree 4 are shown schematically. The engine cable tree extends from the cable 2 through cables connected to it and below it to electrical consumers, not shown, which can also be switched on or off together or individually by a schematic switch 5.

Immediately behind the battery support 3 is a fuse device 6. The fuse device 6 consists of a current-strength sensor 7 with a threshold value switch 8 located downstream, an amplifier 9, and an explosive capsule 10. The explosive capsule acts on a severing device 11 shown schematically. The entire device, shown schematically as consisting of the electronics E, the pyrotechnics P, and the triggering mechanics A, is located in a housing 12 in which a section of the cable 2 also runs. From the cable 2, shown schematically, supply lines 13 and 13' for the threshold value switch 8 and the amplifier 9 depart. The construction of the sensor 7 as well as the additional electronic details are shown in FIG. 2.

Figure 2:
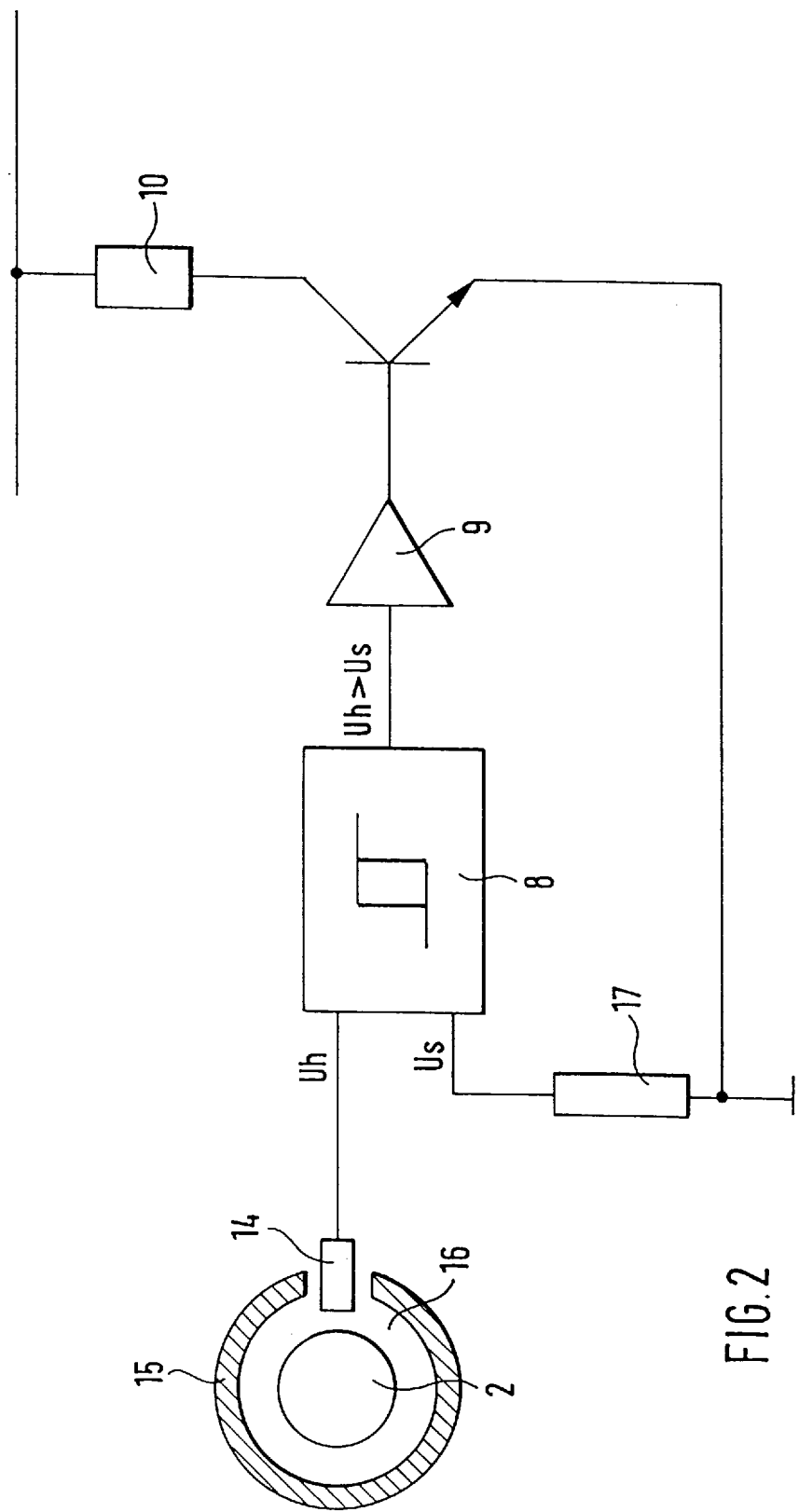
FIG. 2 is a further schematic diagram of the fuse device according to the invention.

In FIG. 2, the sensor 7 consists primarily of a Hall element 14 resting in an iron ring 15. The iron ring 15 surrounds the cable 2 and is insulated electrically from it by an insulating layer 16. The Hall element 14 is connected through an amplifier (not shown) to an input Uh of the threshold value switch 8. The threshold value switch 8 has another input Us for adjusting the triggering threshold.

The output of threshold value switch 8 controls an amplifier 9 whose circuit contains the explosive capsule 10. The latter is a primer known of itself, for example, as is conventionally used in a belt tightener.

Although in FIG. 2 only a rigid triggering threshold for the threshold value switch 8 is shown, instead of the electrical resistance 17 with a constant value provided for the purpose, the latter can also be changed dynamically in order to prevent the triggering of the explosive capsule 10, for example during a high current load caused by the operation, such as when starting an internal combustion engine (not shown). As described above, this adjustment can also be performed in order to take into account different operationally-related current loads and/or different current loads that depend upon the individual vehicle and/or the operating time or other influential factors, for example changes caused by the operation that depend upon the operating temperature, in the current load for cable 2 and to trigger the explosive capsule 10 only when necessary because of an atypically high current load on the cable 2.

FIGS. 3–7 show additional design details of the fuse device. Referring to FIG. 3, an embodiment of the housing is shown in which the areas of electronics, pyrotechnics, and triggering mechanics are integrated. The severing device is designed as a cable cutter 18 and is connected by an air duct 19 with an explosive capsule 10. Rubber lips 20 hold the severing device 18 against the cable 2.

Referring to FIGS. 4A and 4B, further embodiments for the housing are shown. The two possibilities shown each have a cover 21 or 21' which can be mounted pivotably or pluggably on a basic body 22.

Figure 5:
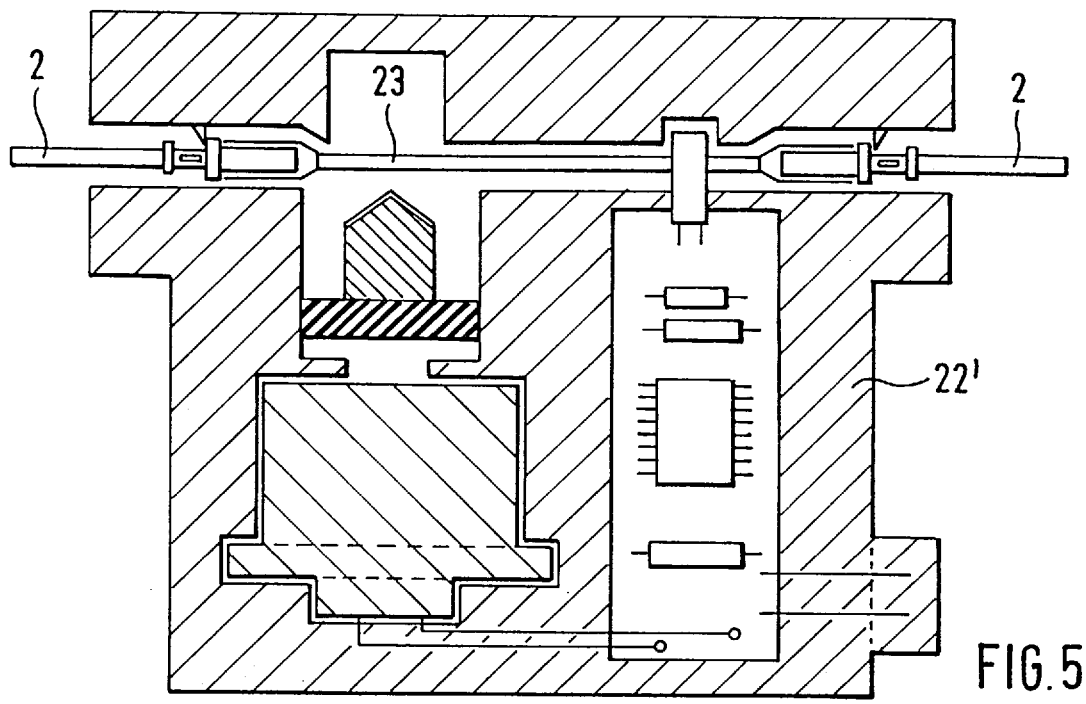
FIG. 5 illustrates a further embodiment of the fuse device according to the present invention.
Figure 6:
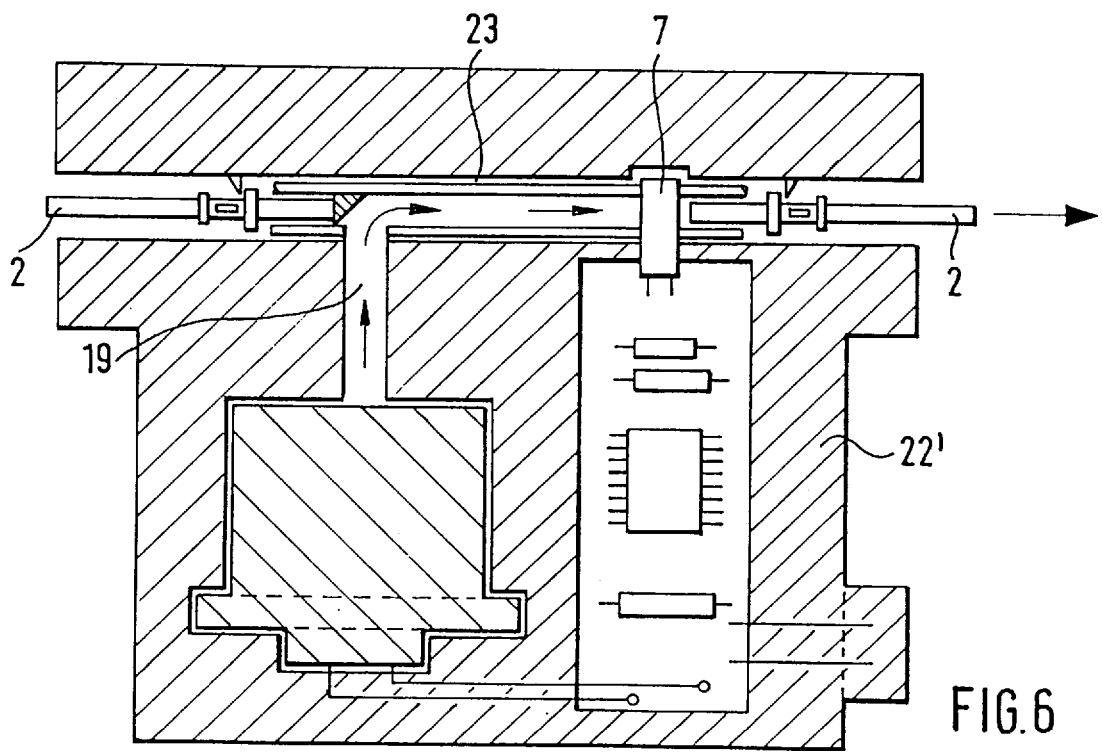
FIG. 6 illustrates yet another embodiment of the fuse device according to the present invention.

The embodiments in FIGS. 5 and 6 show, inside the housing 22', an intermediate line 23, electrically connected at both ends with the cable 2. The cable 2 is releasably connected with the intermediate line 23 which makes it possible, when necessary, to merely replace the fuse device without costly repairs on the cable 2. In FIG. 6, no severing cutters are used, but rather the force generated by the primer acts through an air duct 19' directly on a plug that is forced out of the housing 22' when the primer is triggered.

Figure 7:
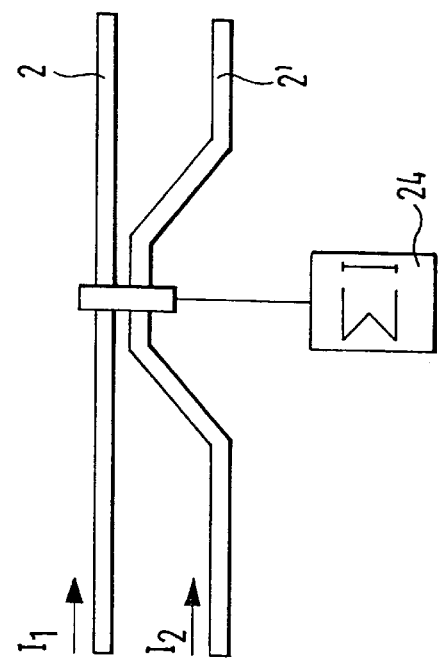
FIG. 7 is a partial schematic view illustrating the multiple severing of a plurality of cables in a fuse device according to the present invention.

FIG. 7 illustrates a suitable branching of air ducts 19 and 19' such that a plurality of cables can be simultaneously cut by severing devices 18 and 18', or, as is not shown here, the force of primer 10 acts simultaneously on several plugs to force them out of the housing.

In addition, it is possible to use a total current 24, composed of $I_{total}=I_1+I_2+ \ldots I_n$, as a triggering criterion.

Figure 8:
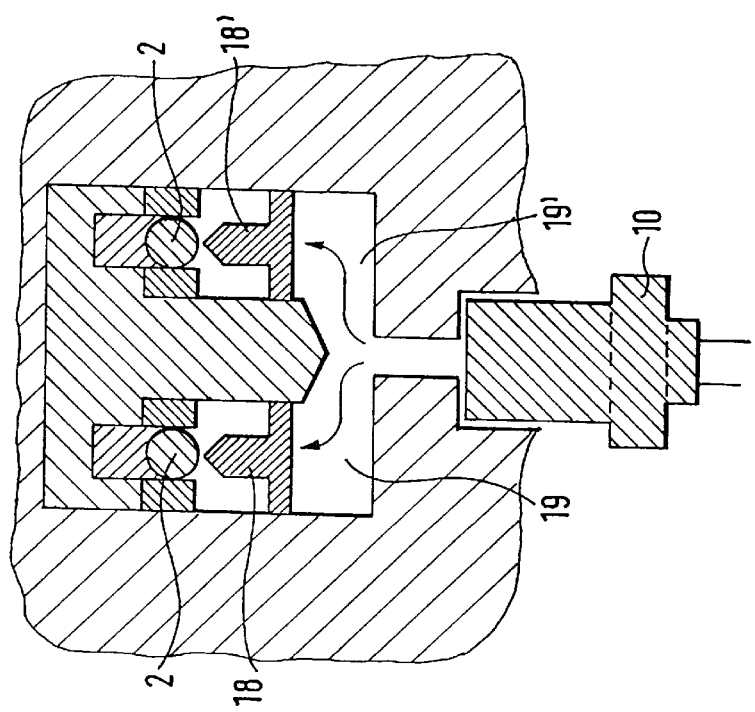
FIG. 8 is another design embodiment of the fuse device according to the invention.
Figure 8:
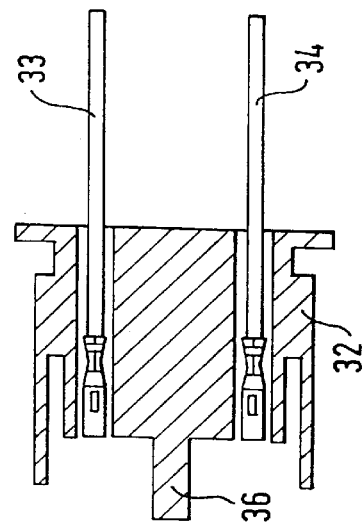
Figure 8:
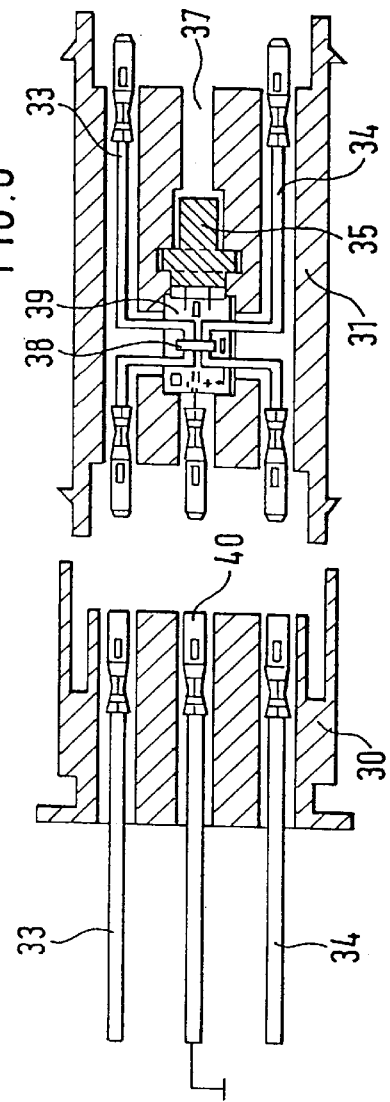

The design principle set forth in FIG. 8 shows a housing composed of a plurality of parts 30, 31, and 32 in which a plurality of cables 33 and 34 run in parallel. Explosive capsule 35 acts on an explosion bolt 36 connected with the housing part 32. The explosion bolt 36 in the resting state lies in a pressure chamber 37 and housing part 31. A current strength sensor 38 is connected with an evaluation circuit 39 and is associated with cables 33 and 34. The current strength sensor 38 measures the total current. If the total current exceeds a threshold value, the explosive capsule 35 is triggered by a threshold value switch located downstream but not shown here.

The power supply to the evaluation circuit 39 comes through one of the two cables 33 or 34. The ground connection is connected with the evaluation circuit 39 as an additional plug-in contact 40. Housing parts 30 and 31 on the one hand and 31 and 32 on the other hand are connected with one another by plug-in contacts that are not drawn individually.

When the explosive capsule 35 is triggered, the liberated gas produces a corresponding force in the pressure chamber 37, and the explosion bolt 36 is forced out of the housing part 31 together with the housing part 32. Hence, the cables 33 and 34 are cut or disconnected.

If repair is required, it is readily possible by loosening the plug contacts to remove the housing part 31 and replace it with a corresponding part. By closing the plug-in contacts, the cut cables 33 and 34 are connected again. The expense required for this is clearly very low.

Figure 9:
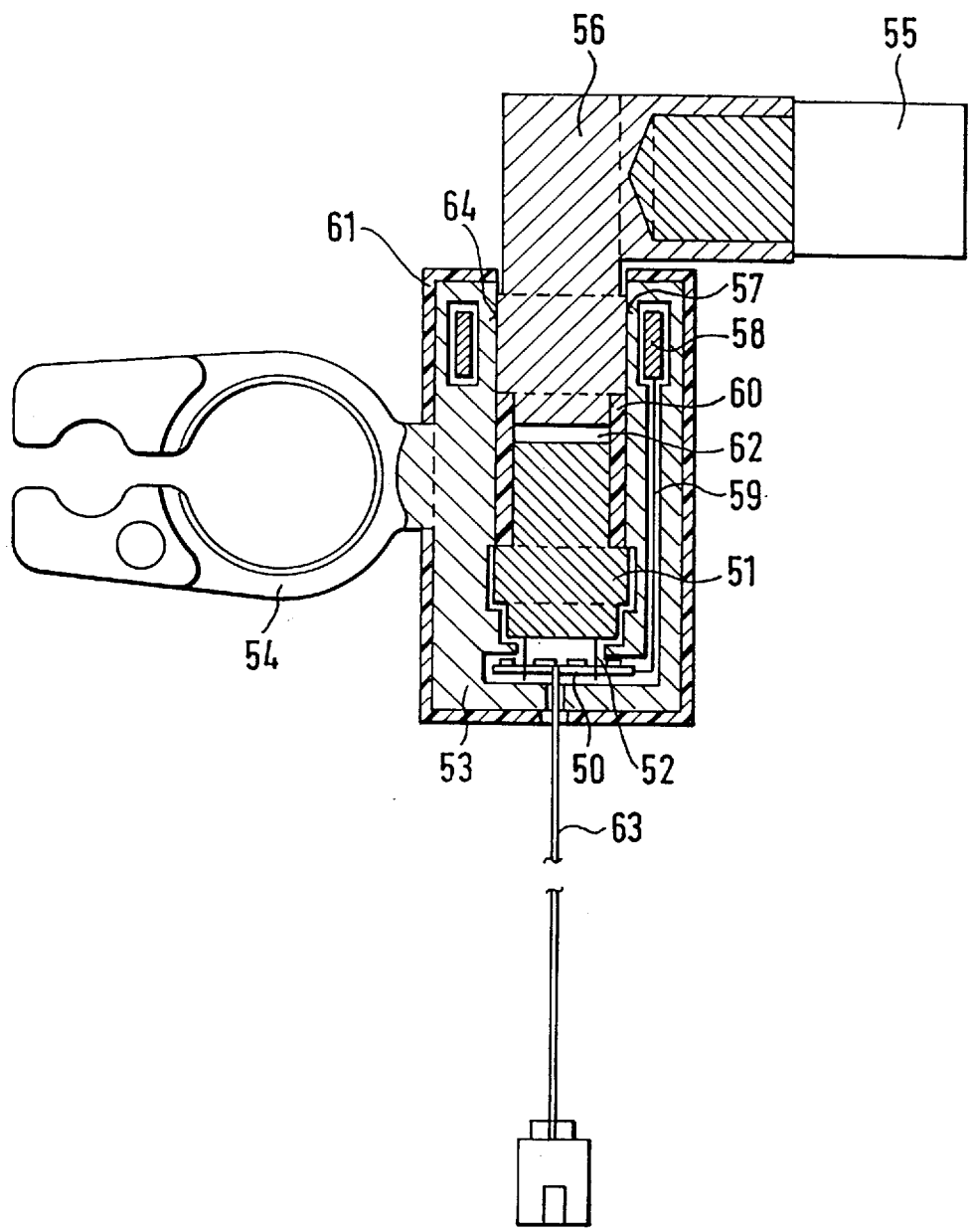
FIG. 9 is a design embodiment of a battery clamp with a built-in fuse device.

FIG. 9 shows a battery clamp in which the pyrotechnics are integrated with the above-mentioned current measurement and triggering control for the pyrotechnics.

The electronics (PC board) 50 are ideally connected directly or through separate connecting leads 52 with the primer 51 and are located in a molded part 53 directly connected with the clamp 54 (part 53 is made of brass or a material with similar electrical and mechanical properties). The connection of the cable 55 is made by a suitably designed plug 56 connected for example, by a press fit 57, with part 53. In the vicinity of the plug-in opening of the part 53, a ferrite core 58 having a Hall element (not shown) is integrated with insulation into the part 53 to detect the current. The Hall element is connected by suitable contact buses or leads 59 with the electronics 50.

In the anterior area of the plug 56, a non-conducting plastic part 60 is located which, in the triggered state, comes loose with plug 56 from part 53 and remains firmly attached to plug 56. When plug 56 springs back, inadvertent contact with the clamp 54 or the molded part 53 is thus prevented.

A plastic extrusion coating 61 on part 53 additionally supports this measure.

When the primer/gas motor 51 is activated, the liberated gas produces a corresponding pressure in prevolume space 62, located between the primer 51 and the plug 56, and the plug 56 is then forced out of the molded part 53 which is electrically conducting and connected in one piece with the clamp 54. The cable 55 is thus cut or disconnected.

The power supply for the electronics is obtained on the positive side directly from the clamp. Ground is provided through a separate connection 63.

The electrical contact between the plug 56 and the expanded battery clamp part 53 is preferably made in the area 64 of the press fit shown here.

Figure 10:
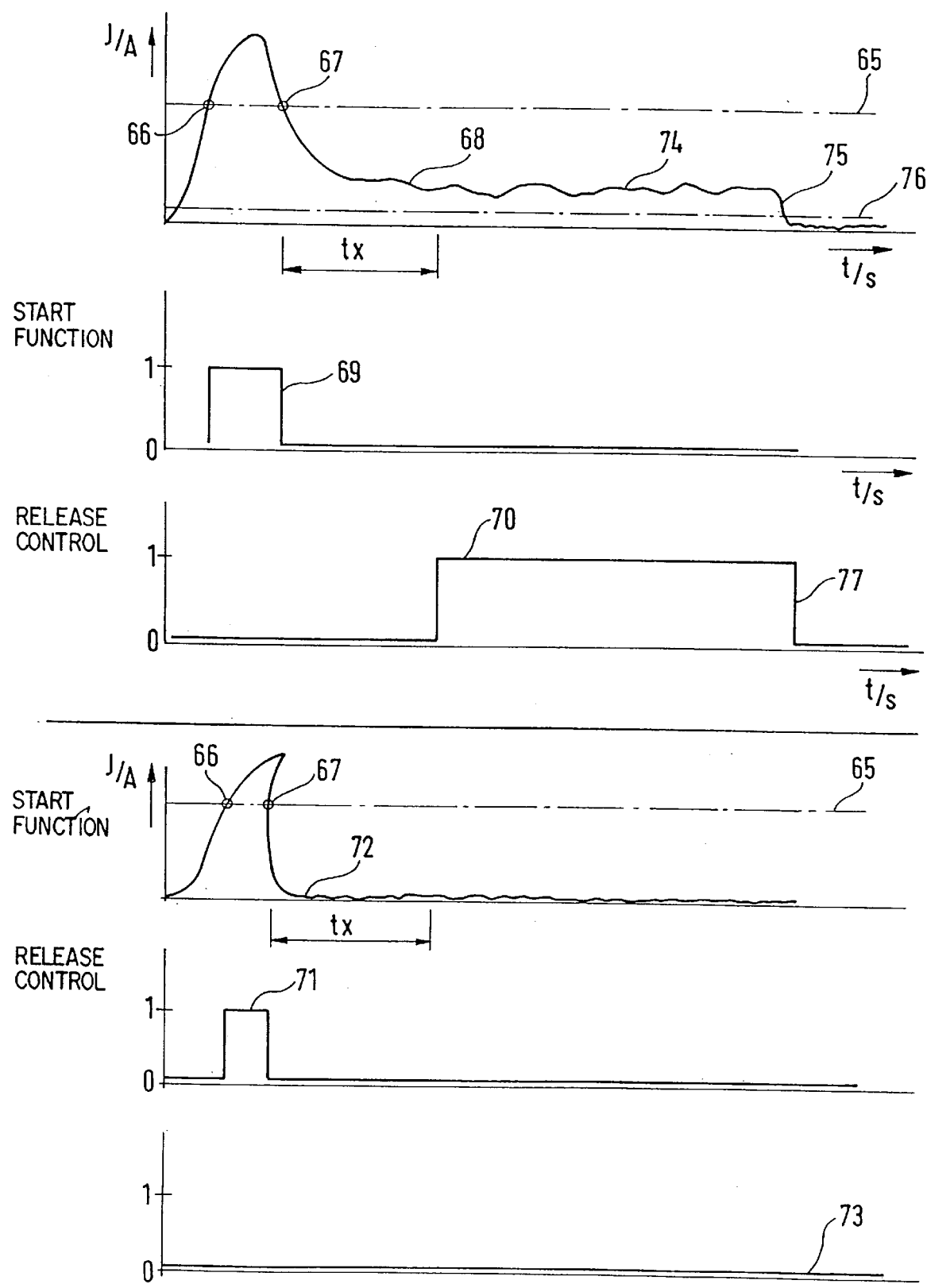
FIG. 10 is a graphical diagram for further explanation of the present invention.

FIG. 10 shows a possible triggering algorithm for the case in which it is desirable to filter out the starting current when starting the vehicle and to activate the fuse monitoring (current measurement) only after the engine has started.

In order to prevent the starting current from being used improperly as a triggering criterion during the starting process, by means of KL50 recognition, the measuring technique can be cutout during the starting process. This possibility has the disadvantage that a KL50 signal from the engine compartment must be wired into the trunk.

Another alternative is the establishment of a triggering threshold which activates the measuring process, in other words turns on the triggering control after the start. This procedure is shown in FIG. 10. During the starting process, a current flows which is above a threshold 65 set in the electronics. When this threshold is exceeded (66) and then undershot (67), and the subsequent current flow (68) differs from zero, the starting process (69) is ended and the triggering control (70) is activated (the direction of the current is of no importance in this regard).

If a starting process (71) is interrupted and no current flow (72) can be detected at that time in the cable to the starter, then the triggering control (73) is blocked.

In the operating case (74) of the vehicle, on the other hand, a current constantly flows from the generator to the battery and/or into the on-board electrical system. If this current is clearly different from zero after parking the vehicle (75), the current flow in the cable between the battery and the starter/generator will be zero. The electronics recognizes this process through a minimum threshold (76) and switches-off the current detection while the vehicle is parked (77).

Although the invention has been described and illustrated in detail, it is to be clearly understood that the same is by way of illustration and example, and is not to be taken by way of limitation. The spirit and scope of the present invention are to be limited only by the terms of the appended claims.

What is claimed is:

1. A fuse device for a cable in a motor vehicle, comprising:
    a current strength sensor;
    an evaluation circuit coupled downstream from said current strength sensor;
    a severing device for permanently severing the cable when a current strength exceeds a limiting value under normal operation of the vehicle; and
    a housing in which a section of the cable runs, and in which said sensor, said evaluation circuit, and said severing device are located.

2. The fuse device according to claim 1, wherein an operating voltage is supplied through said section of the cable in said housing to the evaluation circuit.

3. The fuse device according to claim 2, further comprising an intermediate lead upon which the severing device acts, said cable being electrically coupled at both ends with the intermediate lead.

4. The fuse device according to claim 2, wherein said cable is reversibly releasible from the housing at both ends.

5. The fuse device according to claim 1, wherein said cable is reversibly releasible from the housing at both ends.

6. The fuse device according to claim 5, wherein a plurality of the cables run through the housing, said plurality of cables being simultaneously separable from one another by the severing device.

7. The fuse device according to claim 6, wherein said current sensor simultaneously measures the current in the plurality of cables and, wherein said limiting value is related to a current strength running in at least one of said cables.

8. The fuse device according to claim 1, wherein said housing is divided into two parts, said two parts being separated from one another via the severing device.

9. The fuse device according to claim 8, wherein a plurality of the cables run through the housing, said plurality of cables being simultaneously separable from one another by the severing device.

10. The fuse device according to claim 9, wherein said current sensor simultaneously measures the current in the plurality of cables and, wherein said limiting value is related to a current strength running in at least one of said cables.

11. The fuse device according to claim 1, further comprising an intermediate lead upon which the severing device acts, said cable being electrically coupled at both ends with the intermediate lead.

12. The fuse device according to claim 1, wherein said evaluation circuit additionally receives a blocking signal.

13. The fuse device according to claim 1, further comprising an adjustable threshold value switch coupled to the current strength sensor, wherein the limiting value is adjustable for operationally related variable current strength values in the cable.

14. The fuse device according to claim 1, further comprising a battery clamp, said housing being directly integrated into the battery clamp.

15. The fuse device according to claim 1, wherein said cable is separable via a plug; and
    wherein said severing device acts on said plug in a non-physically contacting manner via a pressure force to sever the cable.

16. The fuse device according to claim 1, wherein a plurality of cables run through the housing, each of said cables being separable via a respective plug; and
    wherein said severing device acts on said plug in a non-physically contacting manner via a pressure force to sever the cable.

17. The fuse device according to claim 1, wherein a portion of said housing in which the section of the cable runs includes a bolt holding said housing portion in contact with a remaining portion of the housing; and
    wherein said severing device operates on said bolt in a non-physically contacting manner via a pressure force to separate said portion of the housing from the remaining portion in order to sever the cable running through said portion of the housing.

18. A fuse device for a cable through which a current passes in a motor vehicle, comprising:
    a current sensor coupled to said cable and having a current strength output signal;
    an evaluation circuit which receives said current strength output signal;
    a severing device coupled to said cable and receiving a severing output signal from said evaluation circuit when a current strength through said cable exceeds a limiting value under normal operation of the vehicle, said severing device operating to permanently sever the cable in response to the severing output signal; and
    a housing in which said current sensor, said evaluation circuit, and said severing device are located, a section of said cable running through the housing.

* * * * *